(12) United States Patent
Vockenberger et al.

(10) Patent No.: US 12,489,205 B2
(45) Date of Patent: Dec. 2, 2025

(54) ANTENNA LAYER STRUCTURES SEPARATED BY FLUID-FILLED CAVITY, AN ANTENNA INLAY, AND A COMPONENT CARRIER

(71) Applicant: AT&S Austria Technologie & Systemtechnik AG, Leoben (AT)

(72) Inventors: Christian Vockenberger, Leoben (AT); Ahmad Bader Alothman Alterkawi, Graz (AT)

(73) Assignee: AT&S Austria Technologies & Systemetechnik Aktiengesellschaft, Leoben (AT)

( * ) Notice: Subject to any disclaimer, the term of this patent is extended or adjusted under 35 U.S.C. 154(b) by 293 days.

(21) Appl. No.: 18/154,161

(22) Filed: Jan. 13, 2023

(65) Prior Publication Data
US 2023/0223683 A1    Jul. 13, 2023

(30) Foreign Application Priority Data
Jan. 13, 2022   (EP) ..................................... 22151403

(51) Int. Cl.
*H01Q 1/52*     (2006.01)
*H01Q 1/40*     (2006.01)
*H01Q 9/04*     (2006.01)

(52) U.S. Cl.
CPC .............. *H01Q 1/526* (2013.01); *H01Q 1/40* (2013.01); *H01Q 9/045* (2013.01)

(58) Field of Classification Search
CPC .......... H01Q 1/526; H01Q 1/52; H01Q 9/045; H01Q 1/40; H01Q 9/0414; H01Q 1/2283; H05K 1/024; H05K 1/0231; H05K 2201/0187; H05K 2201/0195; H05K 2201/10098
See application file for complete search history.

(56) References Cited

U.S. PATENT DOCUMENTS

| 8,451,618 | B2 * | 5/2013 | Boeck .................... H01L 24/14 |
| | | | 361/764 |
| 11,699,855 | B2 * | 7/2023 | Kang .................. H01Q 1/2283 |
| | | | 343/700 R |
| 12,095,142 | B2 * | 9/2024 | Wu ....................... H01L 23/66 |
| 2016/0049723 | A1 | 2/2016 | Baks et al. |
| 2018/0159203 | A1 | 6/2018 | Baks et al. |

(Continued)

FOREIGN PATENT DOCUMENTS

| CN | 111315109 A | 6/2020 |
| JP | 2020088179 A | 6/2020 |
| KR | 20200009279 A | 1/2020 |

OTHER PUBLICATIONS

Niemeijer, R.; Extended European Search Report in Application No. EP 22151403.7; pp. 1-9; Jul. 5, 2022, European Patent Office, 80298, Munich, Germany.

*Primary Examiner* — Hai V Tran
(74) *Attorney, Agent, or Firm* — Robert A. Blaha; Smith Tempel Blaha LLC (57) ABSTRACT

An antenna radiation module for assembling to an antenna inlay for a component carrier or to a component carrier. The module includes a dielectric layer structure and an antenna radiation layer structure. The antenna radiation layer structure is embedded in the first dielectric layer structure. Further, an antenna inlay, a component carrier, and a manufacturing method are described.

18 Claims, 1 Drawing Sheet

(56) References Cited

U.S. PATENT DOCUMENTS

2019/0334232 A1    10/2019  Ha et al.
2019/0385928 A1*   12/2019  Leobandung ......... H01L 23/367
2020/0021010 A1     1/2020  Ou et al.
2020/0329556 A1    10/2020  Baek et al.
2020/0388928 A1*   12/2020  Lin ..................... H01L 23/3128

* cited by examiner

ANTENNA LAYER STRUCTURES SEPARATED BY FLUID-FILLED CAVITY, AN ANTENNA INLAY, AND A COMPONENT CARRIER

CROSS-REFERENCE TO RELATED APPLICATIONS

This application claims the benefit of the filing date of European Patent Application No. 22151403.7 filed Jan. 13, 2022, the disclosure of which is hereby incorporated herein by reference.

TECHNICAL FIELD

Embodiments disclosed herein relate to an antenna radiation module, an antenna inlay and component carriers that include the antenna radiation module or the antenna inlay. Further embodiments relate to methods for manufacturing such component carriers.

BACKGROUND ART

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with ever smaller spacing between these contacts. Removal of heat generated by such electronic components and the component carrier itself during operation becomes an increasing issue. Also, an efficient protection against electromagnetic interference (EMI) becomes an increasing issue. At the same time, component carriers shall be mechanically robust and electrically and magnetically reliable so as to be operable even under harsh conditions. In particular, implementing a radio frequency (RF) or antenna functionality into a component carrier may be considered a challenge.

Conventionally, antenna functionalities with respect to circuit boards are implemented using patch antennas, horn antennas, or metal stamp antennas. These antennas may require to be arranged at a high-performance material in order to guarantee low RF signal loss. A certain distance between an antenna feeding line and an antenna radiation element can be applied to improve the bandwidth and/or performance. In this case, a thick layer of high-performance dielectric material is applied to enlarge said distance. Such high-performance dielectric materials are generally expensive and drive the manufacturing costs.

SUMMARY

There may be a need to provide a robust and reliable antenna functionality for a component carrier in a cost-efficient manner.

An antenna radiation module, a corresponding antenna feeding module, an antenna inlay, a component carrier, a use of the component carrier, and a manufacturing method according to the independent claims are provided.

According to an aspect of the disclosure, there is described an antenna radiation module for assembling to an antenna inlay for a component carrier or to a component carrier, the module comprises or consists of:

i) a first dielectric layer structure (in particular comprising a high frequency optimized, low Dk/Df, material), and
ii) an antenna radiation layer structure (e.g., a copper patch antenna),
wherein the antenna radiation layer structure is (at least partially) embedded (in particular in-plane) in the first dielectric layer structure (e.g., a copper patch antenna).

According to a further aspect of the disclosure, there is described an antenna inlay for a component carrier, the inlay comprising:

i) an antenna radiation module as described above,
ii) an antenna feeding module for assembling to the antenna radiation module, the antenna feeding module comprising:
   iia) a second dielectric layer structure (in particular comprising a high frequency optimized, low Dk/Df, material),
   iib) an antenna feeding layer structure (e.g., a copper patch antenna, an aperture-coupled feed, etc.),
   wherein the antenna feeding layer structure is assembled (surface mounted or embedded) to the second dielectric layer structure, and
iii) a fluid-filled cavity between the first dielectric layer structure and the second dielectric layer structure,
wherein the antenna radiation module is assembled to the antenna feeding module, so that the fluid-filled cavity between the antenna radiation module and the antenna feeding module is at least partially closed.

According to a further aspect of the disclosure, there is described a component carrier, the component carrier comprising:

i) an antenna radiation module as described above,
ii) an antenna feeding module for assembling to the antenna radiation module, the antenna feeding module comprising:
   iia) a second dielectric layer structure (in particular comprising a high frequency optimized, low Dk/Df, material),
   iib) an antenna feeding layer structure (e.g., a copper patch antenna, an aperture-coupled feed, etc.),
   wherein the antenna feeding layer structure is assembled (surface mounted or embedded) to the second dielectric layer structure, and
iii) a fluid-filled cavity between the first dielectric layer structure and the second dielectric layer structure,
wherein the antenna radiation module is assembled to the antenna feeding module, so that the fluid-filled cavity between the antenna radiation module and the antenna feeding module is at least partially closed.

According to a further aspect of the disclosure, there is described a component carrier, comprising:

i) a layer stack with at least one electrically conductive layer structure and/or at least one electrically insulating layer structure, and
ii) an antenna radiation module (as described above) and/or an antenna inlay (as described above) assembled to the layer stack.

According to a further aspect of the disclosure, there is described a use (method of using) a component carrier as described above for a wireless application, in particular at least one of the group which consists of: a 4G and/or 5G functionality, a mm-wave guide functionality, a WiFi functionality, an antenna functionality, a radar functionality, a filter functionality, an RF/HF coupling functionality.

According to a further aspect of the disclosure, there is described a method of manufacturing an antenna radiation module and/or an antenna feeding module (as described above), the method comprises:

i) providing a temporary carrier,
ii) arranging an electrically conductive layer structure on the temporary carrier,
iii) structuring the electrically conductive layer structure to form an antenna layer structure,
iv) assembling, in particular embedding, the antenna layer structure at least partially to a dielectric material that forms a dielectric layer structure, and
v) removing the temporary carrier.

Overview of Embodiments

In the context of the present document, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In an embodiment, the component carrier comprises a (layer) stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact.

The term "layer structure" may particularly denote a continuous layer, a patterned layer or a plurality of non-consecutive islands within a common plane.

In the context of the present document, the term "antenna" may particularly denote an element connected for instance through a transmission line to a receiver or transmitter. Hence, an antenna may be denoted as an electrical member which converts electric power into radio waves, and/or vice versa. An antenna may be used with a controller (for instance a control chip) such as a radio transmitter and/or radio receiver. In transmission, a radio transmitter may supply an electric current oscillating at radio frequency (i.e., a high frequency alternating current) to the antenna, and the antenna may radiate the energy from the current as electromagnetic waves (in particular radio waves). In a reception mode, an antenna may intercept some of the power of an electromagnetic wave in order to provide a small voltage, that may be applied for example to a receiver to be amplified. In embodiments, the antenna may be configured as a receiver antenna, a transmitter antenna, or as a transceiver (i.e., transmitter and receiver) antenna. In an embodiment, the antenna structure may be used for a radar application. In one example, the antenna may be configured as a single antenna. In another example, the antenna may be configured as an (adhered, embedded) antenna array. The antenna structure may, for example, comprise a dipole antenna, a folded dipole antenna, a ring antenna, a rectangular loop antenna, a patch antenna, or a coplanar antenna. The antenna structure may also comprise a yagi antenna or a fractal antenna. A yagi antenna may be a multi-beam directional antenna for so-called mm wave applications. A fractal antenna may be another type of antenna that uses a self-similar design to maximize the length of a material in a total surface area. A fractal antenna may be compact and wideband and can act as an antenna for many different frequencies.

The term "antenna radiation layer structure" may hereby refer to an antenna part/element that is associated with the actual radiation (transmission and/or reception) of electromagnetic waves. The term "antenna feeding layer structure" may refer to an antenna part/element that is not associated with the actual radiation of electromagnetic waves, but which serves as a signal transmission line to the antenna radiation part.

For example, the antenna feeding layer structure may be electrically coupled with an electronic component of a component carrier. Signals provided by said component may be fed to the antenna radiation layer structure for transmission. The other way around, signals received by the antenna radiation layer structure may be fed via the antenna feeding layer structure to the component. The antenna radiation layer structure and the antenna feeding layer structure may be directly electrically connected. In another example, the antenna radiation layer structure and the antenna feeding layer structure may be not electrically connected. In this case, both layer structures may be coupled for example in a capacitive or inductive manner. In an example, the antenna radiation layer structure and/or the antenna feeding layer structure is configured as a winding structure, in particular a patch antenna.

In the context of the present document, the term "dielectric layer structure" may in particular refer to an electrically insulating material that is suitable to be assembled to an antenna layer structure as described above. In order to achieve these requirements, the dielectric layer structure preferably comprises a low signal loss material, in particular a high frequency optimized material. Preferably, such materials may comprise a low dielectric constant Dk and/or a low dissipation factor Df. The material cost of such a dielectric layer structure may be higher than that of a conventional component carrier insulating material (e.g., fiber enforced resin such as FR4), for example five times higher.

In the context of the present document, the term "cavity" may refer to any opening that may be filled by a fluid, in particular a gas, more in particular air. In an example, the cavity is formed, when the antenna radiation module and the antenna feeding module are assembled together. For example, at least one of the modules may comprise a protruding spacer structure that at least partially laterally delimits a cavity. The module to be assembled may be placed onto the spacer structures like a lid and thereby close the cavity at least partially. Hereby, the cavity may remain fluid filled. The cavity may be hermetically closed or comprise ventilation hole(s) for fluid communication with the environment. In a preferred embodiment, the cavity is arranged (sandwiched) between the antenna radiation layer structure and the antenna feeding layer structure.

In the context of the present document, the term "antenna inlay" may refer to a separate component/element that is manufactured in an inlay manufacturing process being (essentially) independent from a component carrier manufacturing process. The antenna inlay may be configured to be surface mounted on or embedded in said component carrier. However, the antenna inlay may be produced, sold, and shipped completely independent of the component carrier. Nevertheless, in an embodiment, the manufacturing process of antenna inlay and component carrier may be intertwined.

The antenna inlay may be formed on the basis of component carrier technology, in particular on the basis of printed circuit board (PCB) technology, and may be surface-mounted or embedded in a separately formed component carrier such as a PCB. However, the antenna inlay component may also be used in conjunction with non-component carrier applications.

In the context of the present document, the term "4G and/or 5G functionality" may refer to known wireless system standards. 4G (or LTE) is an established standard, while 5G is an upcoming technology which is standardized and may be fully established in the near future. The electronic device may also be suitable for future developments such as 6G.

The component carrier/antenna inlay may furthermore comply with WiFi standards such as 2.4 GHz, 5 GHz, and 60 GHz. An electronic device may for example comprise a so-called wireless combo (integrated with WiFi, Bluetooth, GPS . . . ), a radio frequency front end (RFFE), or a low power wide area (LPWA) network module.

In the context of the present document, the term "radar" may refer to an object-detection that uses electromagnetic waves to determine the range, angle, or velocity of one or more objects. A radar arrangement may comprise a transmitter transmitting electromagnetic waves (e.g., in the radio or microwave range). The electromagnetic waves from the transmitter reflect off the object and return to a receiver. Hereby, one antenna structure may be used for transmitting and receiving. Furthermore, a processor such as an electronic component may be used to determine properties of the object such as location and speed based on the received electromagnetic waves.

According to an exemplary embodiment, the disclosure may be based on the idea that a robust and reliable antenna functionality for a component carrier can be provided in a cost-efficient manner, when an antenna radiation layer structure is embedded in a first dielectric layer structure of an antenna radiation module. In particular, the antenna radiation layer may be inserted/embedded in-plane in a high-performance dielectric (the radiation layer may be outwardly oriented, when implemented in a component carrier).

Conventionally, it is believed that the embedding of a radiation structure would cause too much signal losses due to the surrounding material.

However, it has been found surprisingly by the inventors that, when only the sidewalls of the radiating structures are covered with (high-performance HF) dielectrics, the occurrence of signal losses is limited, as the electromagnetic field concentrates at the middle of the exposed metal trace (comprising the radiation structure) rather than on its sidewalls. This is based on the fringing effect. In other words, since the electromagnetic field at the sidewalls is low, the effect of the dielectric material on the electromagnetic field is limited. Based on this observation, the design can be adjusted, and an adjacent air cavity can be made out of inexpensive and low performance dielectric. The thickness of the radiation layer structure may be tuned related to manufacturing purposes (e.g., handling of the panels is easier with thicker radiation layers) or to the desired application.

According to a further exemplary embodiment, the disclosure may be further based on the idea that a robust and reliable antenna functionality for a component carrier can be provided in a cost-efficient manner, when an antenna radiation module and an antenna feeding module are assembled, so that a fluid-filled cavity is obtained between an antenna radiation layer structure of the antenna radiation module and an antenna feeding layer structure of the antenna feeding module.

In conventional build-ups, the signal normally propagates from the feeding layer through a dielectric material towards the radiation layer. As the distance between the feeding and the radiating element can determine the bandwidth, the distance is fixed, and more high-performance dielectrics are needed to minimize the losses.

Instead of said dielectric material, the described modules implement a fluid-filled closed cavity. Thus, the electromagnetic wave propagates from the antenna feeding module through the fluid-filled cavity (not necessarily a waveguide, which has generally a copper coating on the sidewalls) towards the antenna radiation module. Thereby, signal losses as well as the amount of expansive high-performance dielectrics may be reduced.

The fluid-filled cavity may efficiently separate the antenna layer structures from each other, while expensive high-performance dielectric material, which may be conventionally arranged between antenna elements, may be omitted. The inventors have found that the provision of a cost-efficient air cavity is surprisingly sufficient for i) spatially separating antenna radiation and antenna feeding, and ii) enabling a reliable signal coupling between antenna radiation and antenna feeding (for example by capacitive coupling).

In the described manner, electromagnetic waves may propagate through the fluid (air) in the cavity, which almost causes no losses. The antenna signal may be routed to the antenna feeding layer structure (from an electronic component) which may couple the energy to the radiating antenna layer structure. Due to the described modular structure, the antenna modules (and/or the antenna inlay) may be designed and arranged to component carrier(s) in a flexible manner.

According to an embodiment of the antenna radiation module, the antenna radiation layer structure extends (essentially) through the whole (complete) thickness of the first dielectric layer structure. In other words, the antenna radiation layer structure is inserted or fully embedded (encapsulated) in dielectric material. The antenna radiation layer structure may be formed in a coil-like manner, for example with loops that are formed through the dielectric material in the x-y plane, the x-z plane, or the y-z plane. Thereby, the antenna radiation layer structure is efficiently protected. Optionally, a high performance low-loss dielectric material can be used for inserting/embedding that enables an efficient signal transmission.

According to a further embodiment of the antenna radiation module, the first dielectric layer structure comprises two opposed main surfaces, and the antenna radiation layer structure is exposed on at least one of said main surfaces. In this manner, the antenna radiation layer structure may be well mechanically protected by dielectric material, while there is an improved signal transmission (due to the exposed arrangement).

According to a further embodiment, the antenna radiation layer structure is (at least partially) flush with at least one of the two opposed main surfaces. In particular the antenna radiation layer structure is (at least partially) flush with both opposed main surfaces. Such an in-plane design may be especially advantageous with respect to mechanical protection and signal transmission properties.

According to a further embodiment, the antenna radiation layer structure is part of a component carrier (e.g., a layer structure of a component carrier) and the antenna feeding layer structure is assembled to the component carrier to close the cavity.

According to a further embodiment, the antenna radiation module further comprises a first spacer structure (sidewalls) that at least partially delimits the cavity laterally. This may provide the advantage that the cavity is already prepared (delimited) and can be easily closed by the to-be-assembled module in a lid-like manner.

According to a further embodiment, the first dielectric layer structure and/or the second dielectric layer structure comprises a thickness in the range 30 μm to 300 μm. Depending on the frequency/application, the thickness may be advantageously chosen.

According to a further embodiment, the antenna feeding layer structure is arranged on (in particular exposed to the cavity) or embedded in the second dielectric structure. While an embedding may be more protective, a surface mount may yield better signal transmission.

According to a further embodiment, the antenna feeding layer structure is part of a component carrier (e.g., a layer structure of a component carrier) or an antenna inlay and the antenna radiation layer structure is assembled to the component carrier/inlay to close the cavity.

According to a further embodiment, the antenna feeding layer structure is arranged on or embedded in the second dielectric structure.

According to a further embodiment, the antenna feeding module further comprises a second spacer structure (delimiting sidewall) that at least partially delimits the cavity laterally. This may provide the advantage that the cavity is already prepared (delimited) and can be easily closed by the to-be-assembled module in a lid-like manner.

According to a further embodiment, the antenna feeding module further comprises a module layer stack with at least one electrically conductive layer structure and/or at least one electrically insulating layer structure. Circuits/connections that may be needed to fulfill the functioning of a front-end HF module, such as routing (e.g., component connections, such as amplifiers etc.), can be implemented in the antenna feeding module, e.g., at least partially in particular in the module layer stack. The antenna feeding module may be an RF module that is larger than the antenna radiation module (which may contain only one layer). For example, the antenna feeding module may comprise a plurality of different layer structures. In an example, the antenna feeding module may be configured as a small printed circuit board (PCB). In another example, the antenna feeding module is configured as a component carrier. In such an example, the antenna feeding module (e.g., as part of an antenna inlay) may be connected to the component carrier with board-to-board technology (PCB interconnection). The antenna feeding layer structure may be surface mounted (in particular oriented towards the cavity) or embedded in (the center of) the layer stack (see for example FIG. 2).

According to a further embodiment, the fluid-filled air cavity is hermetically closed. According to a further embodiment, the fluid-filled air cavity comprises at least one hole that enables fluid communication with the environment. Both embodiments may provide specific advantages with respect to desired applications. A hermetical seal may be efficient against disturbances, while a fluid communication may be used to establish a specific pressure regime in the cavity.

According to a further embodiment, the antenna radiation layer structure and the antenna feeding layer structure are coupled such that electromagnetic waves propagating between the antenna radiation layer structure and the antenna feeding layer structure pass through the fluid-filled cavity. In other words, the antenna radiation layer structure and the antenna feeding layer structure are electromagnetically coupled.

In the context of the present document, the term "electromagnetic coupling" may particularly denote a coupling that includes the transmission of electromagnetic waves. For example, two antennas may be considered as electromagnetically coupled, when electromagnetic waves (e.g., radio waves) are exchanged between them (i.e., one antenna serves as a transmitter and the other as a receiver of electromagnetic waves). In case that there may be no electrically conductive connection, the electromagnetic coupling (the transfer of electromagnetic waves) may be established by a capacitive coupling (in specific applications an inductive coupling may also be possible).

According to a further embodiment, the coupling is a capacitive coupling and/or an inductive coupling. According to an embodiment, the electromagnetic coupling comprises a transmission of an electromagnetic wave (in particular by capacitive coupling and/or inductive coupling) "over the air". This may provide the advantage that the transmission of electromagnetic waves from the antenna feeding layer structure to antenna radiation layer structure (or the other way around) can be established in a reliable and robust manner without the necessity of an electrically conductive connection.

Capacitive coupling (proximity wave coupling) may be described as the transfer of energy within an electrical network or between distant networks by means of displacement current between circuit(s) nodes, induced by the electric field. This coupling can have an intentional or accidental effect, whereby, in the present case, the capacitive coupling would be an intentional effect.

According to a further embodiment, the antenna radiation layer structure and the antenna feeding layer structure are not electrically connected with each other. In other words, there is no direct electric contact (such as a pad or a wire) between these layer structures. In this manner, conductive material losses can be reduced (such as copper losses), while at the same time, the signal transmission quality can be very high.

According to a further embodiment, the first dielectric layer structure and/or the second dielectric layer structure comprises a low relative permittivity, Dk, material, in particular a Dk value in the range 1.5 to 5, more in particular 1.5 to 4.

According to a further embodiment, the first dielectric layer structure and/or the second dielectric layer structure comprises a low dissipation factor, Df, material, in particular a Df value of not more than 0.005, in particular of not more than 0.003, more particularly not more than 0.0015, at 10 GHz. According to a further example, not more than 0.00015 at 100 GHz. According to a further embodiment, the first dielectric layer structure and/or the second dielectric layer structure comprises a low dissipation factor, Df, material, with a Df value in the range between 0.001 and 0.007 (for example at 10 GHz). This has the advantage that the loss of high frequencies is reduced.

According to a further embodiment, two (or more) different dielectric materials for the radiation layer structure and the feeding layer structure are applied to tune the overall losses of the system. Hence, (two) different dielectric materials with different Df values can be applied, in particular whereas the Df of one dielectric material (preferably the layer having the radiation layer structure embedded), is below 4.

In a preferred embodiment, the dielectric layer comprises a low Df (dissipation factor) value and/or a low Dk (relative permittivity) value. The dielectric layer may be a high frequency dielectric. The term "high-frequency dielectric" may particularly denote an electrically insulating material which has low loss properties when a high-frequency or radio frequency signal propagates from or to an antenna structure in the direct environment of the high-frequency dielectric. In particular, the high-frequency dielectric may have a lower loss than standard prepreg material of a stack of component carrier material. As an example, RO3003™ material, as commercialized by the company Rogers Corporation, can be used as high-frequency dielectric. Another example are materials with a Dk smaller than 4, in particular in the range 1.5 to 4 (for example PTFE or LCP (liquid crystal polymer)). The mentioned high frequency circuit materials may be for example ceramic-filled PTFE (polytetrafluoroethylene) composites.

According to a further embodiment, the antenna radiation layer structure and/or the antenna feeding layer structure comprises a planar antenna structure (e.g., a patch antenna, a dielectric resonator (the embedded structure could be a dielectric material, such as a polymer or a ceramic), and dipole antennas). Additionally, horn antennas can be implemented. Thereby, the antenna may be provided in a reliable and established manner.

According to a further embodiment, the antenna radiation layer structure and/or the antenna feeding layer structure comprises an electrically conductive material (e.g., copper) or an electrically insulating (dielectric) material, e.g., a dielectric resonator antenna (DRA), a filter, an RF/HF coupling device. In one example, the dielectric material comprises a polymer and/or a ceramic, e.g., a polymer-ceramic composite. In another example, the dielectric element comprises a low temperature co-fired ceramic (LTCC). In an embodiment, the dielectric material is a non-layer stack material, i.e., different in its physical/chemical properties from electrically insulating material of the component carrier layer stack. In one example, the dielectric material may be a completely dielectric element. In another example, the dielectric material may comprise a (thin) metal structure such as a coating (e.g., a thin copper coating) on at least one surface.

According to a further embodiment, the antenna radiation layer structure and/or the antenna feeding layer structure is configured as an antenna structure with a coil-like structure, in particular a loop/winding shape. The winding/loop may be along the x-y plane, the x-z plane, or the y-z plane. This may provide the advantage that an antenna (inductance) may be easily provided merely by the form of the antenna layer structure (e.g., square, hexagonal, octagonal, circular).

In the context of the present document, the term "winding" may particularly denote a loop structure (which may be similar to a helical structure with or without corners), wherein multiple of such loops may form a coil-type arrangement. However, due to the component carrier manufacturing technology (for instance involving lamination) of the magnetic inlay and/or due to the used component carrier raw materials (for instance involving planar constituents such as plates and foils), the windings of the coil (like) structure may have edge-like or corner-like portions rather than being limited to a composition of multiple interconnected purely circular structures.

According to a further embodiment, the antenna radiation layer structure and/or the antenna feeding layer structure is (essentially) planar.

According to a further embodiment, the second dielectric layer structure comprises an aperture, and the antenna feeding layer structure is (at least) partially exposed through the aperture. The aperture functions hereby as a tunnel, through which electromagnetic waves propagate. In an example, the dielectric layer structure is exposed to the cavity and the antenna feeding layer structure is covered by the dielectric layer structure. However, the aperture is directly formed at the antenna feeding layer structure and functions as a wave propagating tunnel. The same principle may also be applied to the first dielectric layer structure and the antenna radiation layer structure.

According to a further embodiment, the first dielectric layer structure and the second dielectric layer structure are spatially separated by a spacer structure that at least partially delimits the fluid-filled cavity laterally (functions as a sidewall). The spacer structure may be a support structures such as pillars/columns but may also be a layer structure or even a layer stack. Any suitable structure may be applied that separates the antenna layer structures by a specific distance, while a cavity can be provided. In an example, the spacer structure surrounds (circumferentially) the cavity.

The spacer structure may be exclusively part of the antenna radiation module or the antenna feeding module. In another example, a first spacer structure part may be coupled to the antenna radiation module and a second spacer structure part may be coupled to the antenna feeding module.

According to a further embodiment, the spacer structure comprises at least one of the group which consists of solder, an adhesive, a prepreg, a resin, a sinter (-ed material), a photo-imageable dielectric (PID) material, a printed circuit board material (see examples further below) or a combination thereof. This may provide the advantage that the formation of the spacer structure can be directly implemented in the manufacturing process and established PCB processes and materials can be directly applied. Further, materials such as prepreg or solder provide the option of adhesion and may establish a reliable connection to the antenna modules to be assembled.

According to a further embodiment, the antenna inlay is embedded or surface mounted to the layer stack. While embedding may be considered as a robust protection of the antenna inlay, surface mounting may facilitate electric connections to the antenna inlay. In a further example, the antenna inlay is only partially embedded in a component carrier cavity. In another example, the antenna inlay is attached (laterally) to a component carrier sidewall.

According to a further embodiment, the component carrier further comprises a (electronic) component electrically coupled to the antenna feeding layer structure. Thereby, the antenna feeding layer structure can route signals from and to the component efficiently.

According to a further embodiment, the component is embedded or surface mounted to the layer stack. While embedding may be considered as a robust protection of the component, surface mounting may facilitate electric connections to the component.

According to a further embodiment, the component is a high frequency, HF, functional component. This has the advantage that the electronic component may operate at very high data rates. The HF component may be a chip or a group of chips for a so-called "mm wave" applications. The HF component may be one of the group consisting of HF- CMOS, SiGe, BiCMOS, GaN, GaAs, and InP. Furthermore, the HF component may be configured for a radar application.

According to a further embodiment, the component carrier further comprises a shielding structure that at least partially electromagnetically shields the layer stack from the antenna inlay (in particular the antenna layer structures). In particular, such a shielding may be accomplished in a lateral direction of the stack (i.e., horizontally) and/or in a stacking direction of the stack (i.e., vertically). In such an embodiment, the shielding structure (preferably comprising electrically conductive material such as copper) may function for shielding electromagnetic radiation to thereby suppress undesired effects of electromagnetic interference (EMI), in particular in the radiofrequency (RF) regime.

According to a further embodiment of the method, providing the antenna radiation module and/or the antenna feeding module comprises:
 i) providing a temporary carrier,
 ii) arranged an electrically conductive layer structure on the temporary carrier (using an adhesive),
 iii) structuring (e.g., etching) the electrically conductive layer structure to form an antenna layer structure,
 iv) assembling, in particular embedding, the antenna layer structure (at least partially) to a dielectric material that forms a dielectric layer structure, and
 v) removing the temporary carrier.

In this manner, the antenna radiation module and/or the antenna feeding module may be reliably manufactured using established printed circuit board manufacturing technology.

In another embodiment, the antenna layer structure may be formed by a dielectric material in a comparable manner.

According to a further embodiment, the manufacturing process comprises a (micro) semi-additive process (mSAP). This may be advantageous in the context of HF products. An mSAP structuring may lead to less under-etch and less surface roughness, which may improve signal transmission. The mSAP approach may not use a "thick" copper layer. Yet, the copper thickness may be tunable related to the requirements of the addressed application.

According to a further embodiment, the method further comprises arranging a spacer structure that at least partially delimits the cavity (laterally) on the first dielectric layer structure and/or the second dielectric layer structure.

The spacer structure can be added for example with no-flow prepreg or 2.5D technology. The advantage of using 2.5D may be to have a very exact tolerance which is needed for some applications.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a bare die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming holes through the laminate, for instance by laser drilling or mechanical drilling, and by partially or fully filling them with electrically conductive material (in particular copper), thereby forming vias or any other through-hole connections. The filled hole either connects the whole stack, (through-hole connections extending through several layers or the entire stack), or the filled hole connects at least two electrically conductive layers, called via. Similarly, optical interconnections can be formed through individual layers of the stack in order to receive an electro-optical circuit board (EOCB). Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Scale Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) and/or a photo-imageable or dry-etchable organic material like epoxy-based build-up material (such as epoxy-based build-up film) or polymer compounds (which may or may not include photo- and/or thermosensitive molecules) like polyimide or polybenzoxazole.

In an embodiment, the at least one electrically insulating layer structure (and/or the dielectric layer structure(s)) comprises at least one of the group consisting of a resin or a polymer, such as epoxy resin, cyanate ester resin, benzocyclobutene resin, bismaleimide-triazine resin, polyphenylene derivate (e.g., based on polyphenylenether, PPE), polyimide (PI), polyamide (PA), liquid crystal polymer (LCP), polytetrafluoroethylene (PTFE) and/or a combination thereof. Reinforcing structures such as webs, fibers, spheres or other kinds of filler particles, for example made of glass (multilayer glass) in order to form a composite, could be used as well. A semi-cured resin in combination with a reinforcing agent, e.g., fibers impregnated with the above-mentioned resins is called prepreg. These prepregs are often named after their properties, e.g., FR4 or FR5, which describe their flame-retardant properties. Although prepreg particularly FR4 are usually preferred for rigid PCBs, other materials, in particular epoxy-based build-up materials (such as build-up films) or photo-imageable dielectric materials, may be used as well. For high frequency applications, high-frequency materials such as polytetrafluoroethylene, liquid crystal polymer and/or cyanate ester resins, may be preferred. Besides these polymers, low temperature cofired ceramics (LTCC) or other low, very low or ultra-low DK materials may be applied in the component carrier as electrically insulating structures.

In an embodiment, the at least one electrically conductive layer structure comprises at least one of the group consisting of copper, aluminum, nickel, silver, gold, palladium, tungsten and magnesium. Although copper is usually preferred, other materials or coated versions thereof are possible as well, in particular metals or other materials coated with supra-conductive material or conductive polymers, such as graphene or poly(3,4-ethylenedioxythiophene) (PEDOT), respectively.

At least one component may be embedded in the component carrier and/or may be surface mounted on the component carrier. Such a component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. An inlay can be for instance a metal block, with or without an insulating material coating (IMS-inlay), which could be either embedded or surface mounted for the purpose of facilitating heat dissipation. Suitable materials are defined according to their thermal conductivity, which should be at least 2 W/mK. Such materials are often based, but not limited to metals, metal-oxides and/or ceramics as for instance copper, aluminium oxide ($Al_2O_3$) or aluminum nitride (AlN). In order to increase the heat exchange capacity, other geometries with increased surface area are frequently used as well. Furthermore, a component can be an active electronic component (having at least one p-n-junction implemented), a passive electronic component such as a resistor, an inductance, or capacitor, an electronic chip, a storage device (for instance a DRAM or another data memory), a filter, an integrated circuit (such as a field-programmable gate array (FPGA), programmable array logic (PAL), generic array logic (GAL) and complex programmable logic devices (CPLDs)), a signal processing component, a power management component (such as a field-effect transistor (FET), metal-oxide-semiconductor field-effect transistor (MOSFET), complementary metal-oxide-semiconductor (CMOS), junction field-effect transistor (JFET), or insulated-gate field-effect transistor (IGFET), all based on semiconductor materials such as silicon carbide (SiC), gallium arsenide (GaAs), gallium nitride (GaN), gallium oxide ($Ga_2O_3$), indium gallium arsenide (InGaAs), indium phosphide (InP) and/or any other suitable inorganic compound), an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, an RF chip, a HF chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be an IC substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such a solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable.

A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), Electroless Nickel Immersion Palladium Immersion Gold (ENIPIG), gold (in particular hard gold), chemical tin, nickel-gold, nickel-palladium, etc.

The defined aspects and further aspects of the disclosure are apparent from the example embodiments described hereinafter and are explained with reference to these illustrated example embodiments.

DETAILED DESCRIPTION OF ILLUSTRATED EMBODIMENTS

The illustrations in the drawings are schematically presented. In different drawings, similar or identical elements are provided with the same reference signs.

Before, referring to the drawings, exemplary embodiments will be described in further detail and some basic considerations will be summarized based on which exemplary embodiments of the disclosure have been developed.

According to an exemplary embodiment, the implementation of air cavities in RF modules between antenna layers within a PCB without the need for electrical connection between these layers can be provided. The air cavity (defined by spacer structures around the cavity) could be made out of inexpensive and low performance material, while the antenna assembled dielectric layers are made out of expensive and high-performance material. The RF module and antenna can me manufactured separately which enables symmetric build ups. This concept could be used to implement inverted antenna forms and could be extended for antenna arrays and other RF components such as filters and couplers.

According to an exemplary embodiment, a main advantage is that the material below the antenna radiating structure is removed (cavity formation) to reduce the losses during signal transmission. It has been shown that the radiating structure can be embedded, as the electromagnetic wave concentrates at the exposed surfaces of the radiation structure and not (or only negligible) at the embedded sidewalls.

The radiation structure can be fully or partially embedded (inserted). Both or only one main surface (respectively the outwardly oriented surface, as the radiating structure should radiate the signal towards the environment) can be exposed.

Figure 1:
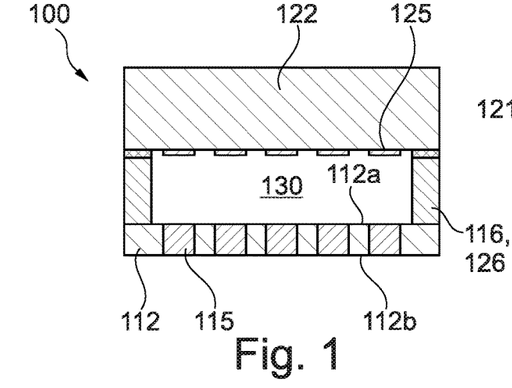
FIG. 1 shows a side view of an antenna inlay according to an exemplary embodiment of the disclosure.

FIG. 1 shows a side view of an antenna inlay 100 according to an exemplary embodiment of the disclosure. The antenna inlay 100 comprises: i) an antenna radiation module 110 with a first dielectric layer structure 112 and an antenna radiation layer structure 115, wherein the antenna radiation layer structure 115 is embedded in the first dielectric layer structure 115. The antenna radiation layer structure 115 extends essentially through the whole thickness (extends completely through) of the first dielectric layer structure 112. The first dielectric layer structure 112 comprises two opposed main surfaces 112a, 112b, and the antenna radiation layer structure 115 is exposed on both main surfaces 112a, 112b; and ii) an antenna feeding module 120 with a second dielectric layer structure 122 and an antenna feeding layer structure 125, wherein the antenna feeding layer structure 125 is assembled to the second dielectric layer structure. In the example shown, the antenna feeding layer structure 125 is surface mounted to the bottom main surface of the antenna feeding layer structure 125.

The antenna radiation module 110 is assembled to the antenna feeding module 120, so that a fluid-filled cavity 130 between the antenna radiation module 110 and the antenna feeding module 120 is closed. Hereby, the fluid-filled cavity 130 is sandwiched between the antenna radiation layer structure 115 and the antenna feeding layer structure 125 and spatially separates these layer structures 115, 125 from each other. Said fluid-filled cavity 130 is laterally delimited by a spacer structure 116, 126 which comprises solder and a PCB material such as resin. The spacer structure 116, 126 serves as a sidewall that laterally delimits the cavity 130.

The antenna radiation layer structure 115 and the antenna feeding layer structure 125 are (electromagnetically) coupled such that electromagnetic waves propagating between the antenna radiation layer structure 115 and the antenna feeding layer structure 125 pass through the fluid-filled cavity 130. The electromagnetic coupling is a capacitive coupling and/or an inductive coupling. In this manner, the antenna radiation layer structure 115 and the antenna feeding layer structure 125 are not (directly) electrically connected with each other.

The first dielectric layer structure 112 and the second dielectric layer structure 122, respectively, comprises a low relative permittivity Dk material with a Dk value smaller than 3 and a low dissipation factor Df material with a Df value of not more than 0.005 at 10 GHz (i.e., a high-performance dielectric material).

The antenna radiation layer structure 115 is configured as an antenna structure with a loop shape through the material of the first dielectric layer structure 112.

Figure 2:
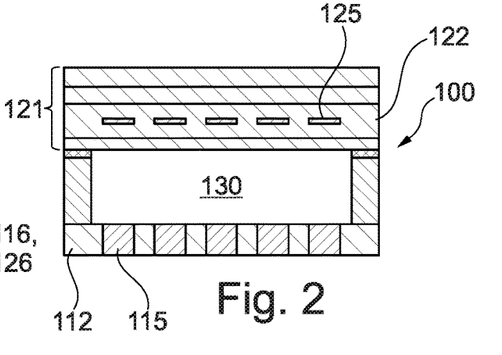
FIG. 2 shows a side view of an antenna inlay according to another exemplary embodiment of the disclosure.

FIG. 2 shows a side view of an antenna inlay 100 according to another exemplary embodiment of the disclosure. The antenna inlay 100 is very similar to the one shown in FIG. 1 with the difference that the antenna feeding module 120 comprises a module layer stack 121 with a plurality of electrically insulating layer structures, one of which is the second dielectric layer structure 122. The antenna feeding layer structure 125 is in this example embedded in the second dielectric layer structure 122, which is further embedded in the layer stack 121. Components such as ICs that can be necessary for routing/feeding (functionalities of an RF front end module) etc. can be implemented in the second dielectric layer structure 122.

Figure 3:
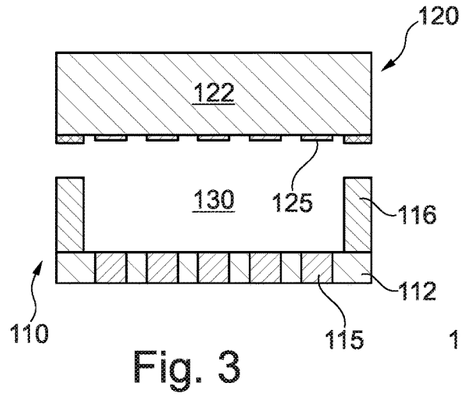
FIG. 3 shows a side view of an assembling step of an antenna radiation module and an antenna feeding module according to an exemplary embodiment of the disclosure.

FIG. 3 shows a side view of an assembling step of an antenna radiation module 110 and an antenna feeding module 120 according to an exemplary embodiment of the disclosure. In this example, the antenna radiation module 110 comprises the protruding spacer structure 116 that (circumferentially) delimits the fluid-filled cavity 130. The antenna feeding module 120 comprises solder or an adhesive for adhering to the spacer structure 116 of the antenna radiation module 110 and thereby close the cavity 130.

Figure 4:
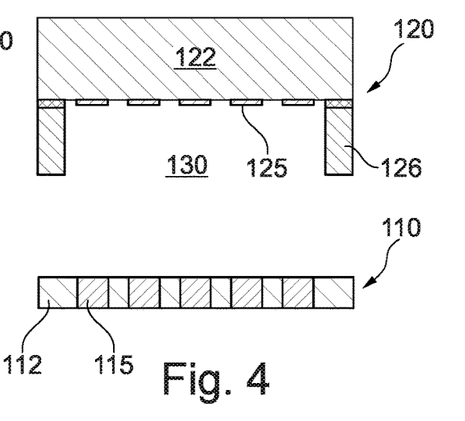
FIG. 4 shows a side view of an assembling step of an antenna radiation module and an antenna feeding module according to another exemplary embodiment of the disclosure.

FIG. 4 shows a side view of an assembling step of an antenna radiation module 110 and an antenna feeding module 120 according to another exemplary embodiment of the disclosure. In this example, the antenna feeding module 120 comprises the protruding spacer structure 126 that (circumferentially) delimits the fluid-filled cavity 130. The antenna feeding module 120 comprises solder or an adhesive for adhering to the spacer structure 116. After the antenna radiation module 110 and an antenna feeding module 120 have been assembled to each other, the fluid-filled cavity 130 will be closed.

FIGS. 5A-5D show a manufacturing process of an antenna radiation module 110 according to an exemplary embodiment of the disclosure. The antenna feeding module 120 can be manufactured in a similar manner.

Figure 5A:
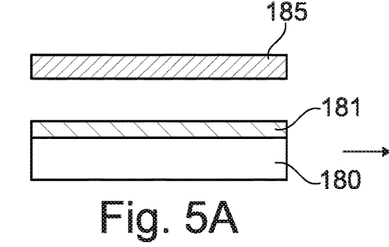
FIG. 5A, FIG. 5B, FIG. 5C, and FIG. 5D show a manufacturing process of an antenna radiation module according to an exemplary embodiment of the disclosure.

In FIG. 5A a temporary carrier 180 with an adhesive layer 181 is provided. An electrically conductive layer structure 185, for example a (thick) copper foil, is arranged on the temporary carrier 180 and attached to the adhesive layer 181.

Figure 5B:
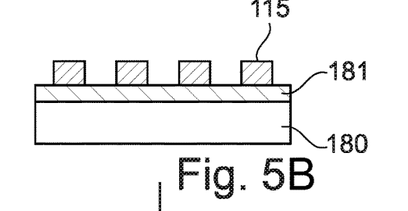

In FIG. 5B the electrically conductive layer structure 185 is structured/patterned (e.g., etched to a specific shape) to yield an antenna layer structure 115.

Figure 5C:
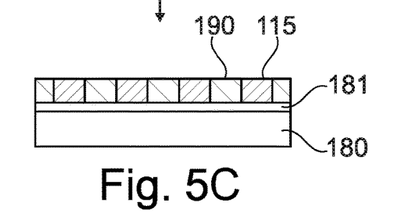

In FIG. 5C the antenna layer structure 115 is embedded in dielectric material 190 that forms a dielectric layer structure 112. For example, a b-staged dielectric material 190 with cut-outs is laminated to the (etched) electrically conductive layer structure 185.

Figure 5D:
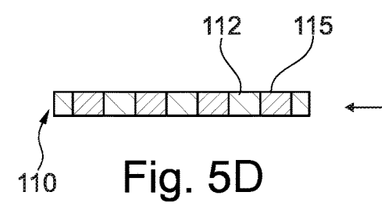

In FIG. 5D the temporary carrier 180 is removed and the final antenna radiation module 110 is obtained. The spacer structure (not shown) can be added with no-flow prepreg or 2.5D technology.

Alternatively or additionally, an mSAP manufacturing can be applied.

It should be noted that the term "comprising" does not exclude other elements or steps and the article "a" or "an" does not exclude a plurality. Also, elements described in association with different embodiments may be combined.

Implementation of the disclosure is not limited to the preferred embodiments shown in the figures and described above. Instead, a multiplicity of variants is possible which variants use the solutions shown and the principle according to the disclosure even in the case of fundamentally different embodiments.

LIST OF REFERENCE SIGNS

100 Antenna inlay, component carrier
110 Antenna radiation module
112 First dielectric layer structure
115 Antenna radiation layer structure
116 First spacer structure
120 Antenna feeding module
121 Module layer stack
122 Second dielectric layer structure
125 Antenna feeding layer structure
126 Second spacer structure
128 Module layer stack
130 Cavity
180 Temporary carrier
181 Adhesive layer structure
185 Electrically conductive layer structure
190 Dielectric material

The invention claimed is:

1. An antenna radiation module for assembling to an antenna inlay for a component carrier or to a component carrier, the antenna radiation module comprising:
   a first dielectric layer structure; and
   an antenna radiation layer structure;
   wherein the antenna radiation layer structure is embedded in the first dielectric layer structure;
   wherein the first dielectric layer structure comprises two opposed main surfaces, and the antenna radiation layer structure includes respective elements exposed at the two opposed main surfaces,
   wherein the respective elements of the antenna radiation layer structure extend through the whole thickness of the first dielectric layer structure.

2. The antenna radiation module according to claim 1, wherein the antenna radiation layer structure is at least partially flush with at least one of the two opposed main surfaces.

3. The antenna radiation module according to claim 1, further comprising:
   a first spacer structure that at least partially delimits a cavity laterally.

4. An antenna inlay for a component carrier or a component carrier, the antenna inlay or the component carrier comprising:
   an antenna radiation module including
      a first dielectric layer structure; and
      an antenna radiation layer structure;
      wherein the antenna radiation layer structure is embedded in the first dielectric layer structure;
      wherein the first dielectric layer structure comprises two opposed main surfaces, and the antenna radiation layer structure includes respective elements exposed at the two opposed main surfaces;
      wherein the respective elements of the antenna radiation layer structure extend through the whole thickness of the first dielectric layer structure,
   an antenna feeding module for assembling to the antenna radiation module, the antenna feeding module comprising:
      a second dielectric layer structure;
      an antenna feeding layer structure;
      wherein the antenna feeding layer structure is assembled to the second dielectric layer structure; and
      a fluid-filled cavity between the first dielectric layer structure and the second dielectric layer structure;
   wherein the antenna radiation module is assembled to the antenna feeding module, so that the fluid-filled cavity between the antenna radiation module and the antenna feeding module is at least partially closed.

5. The antenna inlay or the component carrier according to claim 4, wherein the antenna feeding layer structure is arranged on or embedded in the second dielectric structure.

6. The antenna inlay or the component carrier according to claim 4, further comprising:
   a spacer structure that at least partially delimits the cavity laterally.

7. The antenna inlay or the component carrier according to claim 4, further comprising:

a module layer stack with at least one of an electrically conductive layer structure or at least one electrically insulating layer structure.

8. The antenna inlay or the component carrier according to claim 4,
wherein the fluid-filled cavity is hermetically closed; or
wherein the fluid-filled cavity comprises at least one hole that enables fluid communication.

9. The antenna inlay or the component carrier according to claim 4,
wherein the antenna radiation layer structure and the antenna feeding layer structure are coupled such that electromagnetic waves propagating between the antenna radiation layer structure and the antenna feeding layer structure pass through the fluid-filled cavity.

10. The antenna inlay or the component carrier according to claim 4,
wherein the antenna radiation layer structure and the antenna feeding layer structure are not electrically connected with each other.

11. The antenna inlay or the component carrier according to claim 4, further comprising at least one of the following features:
wherein at least one of the first dielectric layer structure or the second dielectric layer structure comprises a Dk value smaller than 4;
wherein at least one of the first dielectric layer structure or the second dielectric layer structure comprises a low dissipation factor, Df, material with a Df value of not more than 0.005;
wherein at least one of the first dielectric layer structure or the second dielectric layer structure comprises a low dissipation factor, Df, material, with a Df value in the range between 0.001 and 0.007;
wherein at least one of the first dielectric layer structure or the second dielectric layer structure comprises a thickness in the range 30 μm to 300 μm.

12. The antenna inlay or the component carrier according to claim 4,
wherein at least one of the antenna radiation layer structure or the antenna feeding layer structure comprises a planar antenna.

13. The antenna inlay or the component carrier according to claim 4,
wherein the second dielectric layer structure comprises an aperture, and
wherein the antenna feeding layer structure is partially exposed through the aperture.

14. The antenna inlay or the component carrier according to claim 4,
wherein the first dielectric layer structure and the second dielectric layer structure are spatially separated by a spacer structure that at least partially delimits the fluid-filled cavity laterally.

15. A component carrier, comprising:
a layer stack with at least one of at least one electrically conductive layer structure or at least one electrically insulating layer structure;
an antenna radiation module assembled to the layer stack, the antenna radiation module including
a first dielectric layer structure with opposed main surfaces; and
an antenna radiation layer structure with respective elements embedded in the first dielectric layer structure and exposed at the opposed main surfaces; wherein the respective elements of the antenna radiation layer structure extend through the whole thickness of the first dielectric layer structure,
or
an antenna inlay assembled to the layer stack, the antenna inlay comprising:
an antenna radiation module including
a first dielectric layer structure with opposed main surfaces; and
an antenna radiation layer structure with respective elements embedded in the first dielectric layer structure and exposed at the opposed main surfaces wherein the respective elements of the antenna radiation layer structure extend through the whole thickness of the first dielectric layer structure;
an antenna feeding module assembled to the antenna radiation module, the antenna feeding module comprising:
a second dielectric layer structure;
an antenna feeding layer structure;
a fluid-filled cavity between the first dielectric layer structure and the second dielectric layer structure;
wherein the fluid-filled cavity between the antenna radiation module and the antenna feeding module is at least partially closed.

16. The component carrier according to claim 15, wherein the component carrier comprises an antenna inlay and an antenna feeding layer structure, further comprising at least one of the following features:
wherein the antenna inlay is embedded in or surface mounted to the layer stack;
further comprising a component electrically coupled to the antenna feeding layer structure;
wherein the component is embedded in or surface mounted to at least one of the antenna radiation module, the antenna feeding module, the antenna inlay, the layer stack;
wherein the component is a high frequency functionality component;
a shielding structure that at least partially electromagnetically shields the layer stack from the antenna inlay.

17. A method of manufacturing at least one of an antenna radiation module or an antenna feeding module, the method comprising:
providing a temporary carrier;
arranging an electrically conductive layer structure on the temporary carrier;
structuring the electrically conductive layer structure to form an antenna layer structure;
assembling the antenna layer structure at least partially to a dielectric material that forms dielectric layer structure, wherein the dielectric layer structure comprises two opposed main surfaces, and the antenna layer structure includes respective elements exposed at the two opposed main surfaces, wherein the respective elements of the antenna layer structure extend through the whole thickness of the dielectric layer structure; and
removing the temporary carrier.

18. A method of manufacturing an antenna inlay for a component carrier or a component carrier, the method comprising:
providing an antenna radiation module comprising:
a first dielectric layer structure with two opposed main surfaces; and
an antenna radiation layer structure with respective elements embedded in the first dielectric layer structure;

wherein the respective elements of the antenna radiation layer structure are exposed at the two opposed main surfaces of the first dielectric structure, wherein the respective elements of the antenna radiation layer structure extend through the whole thickness of the first dielectric layer structure; and assembling the antenna radiation module to an antenna feeding module, such that a fluid-filled cavity between the antenna radiation module and the antenna feeding module is at least partially closed.

* * * * *